(12) United States Patent
Yu (10) Patent No.: US 6,880,143 B1
(45) Date of Patent: Apr. 12, 2005

(54) METHOD FOR ELIMINATING VIA BLOCKING IN AN IC DESIGN

(75) Inventor: Hongtao Yu, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 333 days.

(21) Appl. No.: 10/302,645

(22) Filed: Nov. 22, 2002

(51) Int. Cl.$^7$ .............................................. G06F 9/45
(52) U.S. Cl. .................... 716/8; 716/9; 716/10
(58) Field of Search ............ 716/1, 8–17; 257/774–776

(56) References Cited

U.S. PATENT DOCUMENTS

| | | | | |
|---|---|---|---|---|
| 5,315,534 A | * | 5/1994 | Schlachet | 716/12 |
| 5,483,461 A | * | 1/1996 | Lee et al. | 716/14 |
| 5,487,037 A | * | 1/1996 | Lee | 365/189.11 |
| 5,793,643 A | * | 8/1998 | Cai | 716/12 |
| 6,404,226 B1 | * | 6/2002 | Schadt | 326/41 |

* cited by examiner

*Primary Examiner*—Vuthe Siek
*Assistant Examiner*—Binh Tat (74) *Attorney, Agent, or Firm*—Daniel J. Bedell; Smith-Hill and Bedell (57) ABSTRACT

An IC design indicating positions of cells within an IC is processed to determine whether conductors residing above the cells block via access to an input/output (I/O) terminal on an upper surface of any of the cells. Each cell spans several contiguous via spaces in a horizontal direction with each via space being sufficiently wide in that direction to contain a via extending upward from any I/O terminal occupying that via space. For each cell having an I/O terminal requiring via access, a separate first data word corresponding to each I/O terminal of that cell is generated. Each bit of the first data word corresponds to a separate one of the via spaces spanned by the cell and indicates whether the I/O terminal corresponding to that first data word occupies that via space. The IC design is also processed to generate a second data word for each cell, wherein each bit of the second data word also corresponds to a separate one of the via spaces spanned by the cell and indicates whether any one of the conductors occupies that via space. The second data word is logically ANDed with each first data word to produce a separate third data word corresponding to each I/O terminal indicating whether the conductors block via access to the I/O terminal.

16 Claims, 5 Drawing Sheets

METHOD FOR ELIMINATING VIA BLOCKING IN AN IC DESIGN

BACKGROUND OF THE INVENTION

1. Field of the Invention

The present invention relates in general to placement and routing (P&R) tools for generating integrated circuit (IC) layouts and in particular to a method for enabling a P&R tool to determine when a power grid blocks input/output access to any terminal of a cell within an IC layout.

2. Description of Related Art

Figure 1:
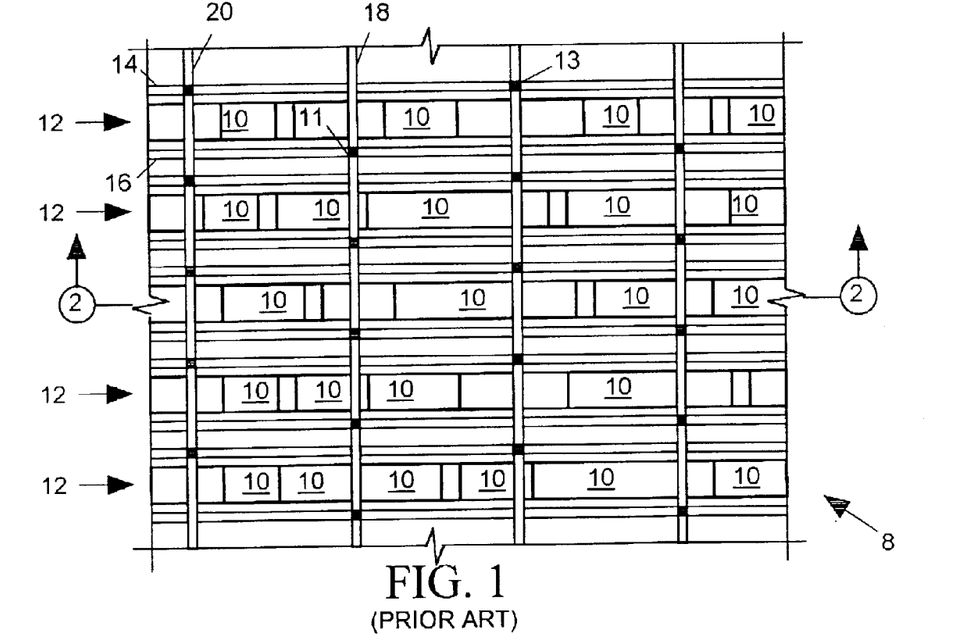
FIG. 1 is a simplified plan view of a portion of a prior art integrated circuit (IC)
Figure 2:
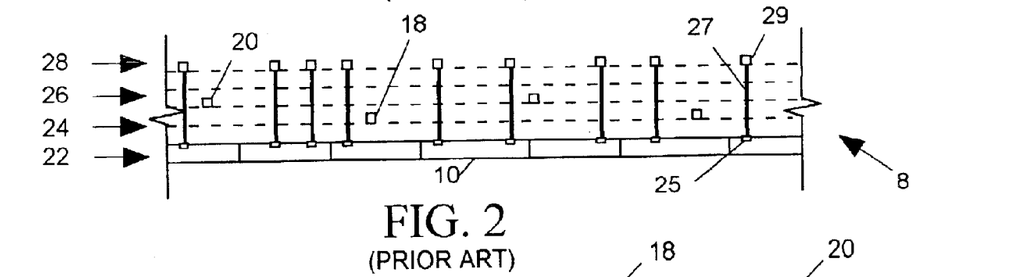
FIG. 2 is a sectional elevation view of the IC of FIG. 1.

FIG. 1 is a simplified plan view of layers of a portion of a prior art integrated circuit 8 superimposed over one another, and FIG. 2 is a partial sectional elevation view of IC 8 of FIG. 1 along cut line 2—2. As illustrated in FIGS. 1 and 2, the various cells 10 of an integrated circuit are typically formed within a horizontally planar semiconductor substrate 22 aligned along a set rows 12 extending in an east-west direction. The cells 10 along each row 12 are normally of uniform height but vary in width. Depending on the density with which cells are packed along a row 12, not all space along each row 12 may be occupied by cells 10. Power and ground lines 14 and 16 also extending in the east/west direction parallel to each row 12 deliver power and ground signal to each cell 10 along the row. An array of ground lines 20 above cells 10, extending in a north/south direction on an IC layer 24 tie all of the east/west ground lines 16 together through vertically extending conductors (vias) 11. Similarly, an array of north/south power lines 18 residing on another layer 26 above cells 10 tie all of the east/west power lines 14 together through vias 13. Power lines 14 and 20 and ground lines 16 and 18 thus form separate power and ground distribution grids for distributing power and ground from the IC's external power and ground input/output terminals (not shown) to all cells 10.

North/south power and ground lines 18 and 20 are provided to help evenly distribute current loads on the individual east/west power or ground lines 14 or 16. When cells 10 along one row 12 draw an unusually large amount of supply current, not all of that current need be supplied through its adjacent east/west power and ground lines 14 and 16; the north/south lines 18 and 20 redirect current from more lightly loaded power and ground lines 14 and 16 serving nearby cell rows 12 to the cell rows that need it.

There has been a trend toward increasing the density of (i.e. reducing the distance between) the north/south power and ground lines 18 and 20 to more evenly distribute power on the grids. However increasing power line density makes it more difficult to position cells 10 along rows 12 because it increases the likelihood that power and ground conductors will block signal access to I/O terminals 25 on surfaces of cells 10 that communicate through vertical conductors (vias) 27 with conductors 29 on higher signal distribution layers 28 as shown in FIG. 2.

Figure 3:
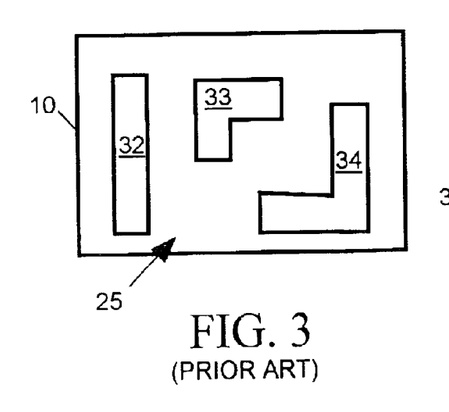
FIG. 3 is a simplified plan view of a cell of the IC of FIG. 1 illustrating positions of input/output (I/O) terminals on a surface of the cell.

FIG. 3 is a simplified plan view of a cell 10 showing a set of conductive areas 32, 33 and 34 on the upper surface of the cell that act as the cell's input/output (I/O) terminals 25. As shown in FIG. 2, vias 27 extend upward from such input/output terminals on cells 10 to signal distribution layers 28 above the power and ground distribution layers 24 and 26. Conductors 29 residing on signal distribution layers 28 interconnect vias to form various signal paths between I/O terminals 25 of cells 10.

Figure 4:
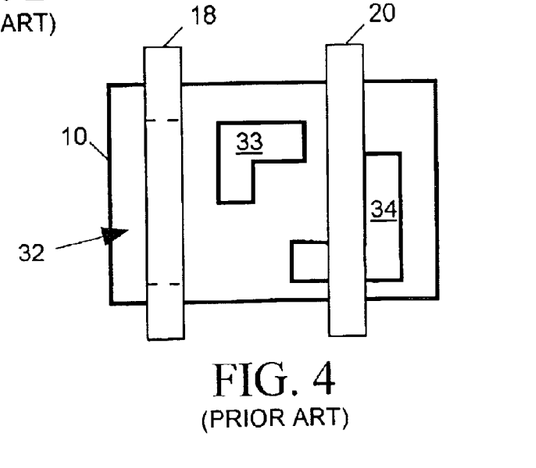
FIGS. 4 and 5 are simplified plan views of power and ground conductors superimposed over the cell of FIG. 3 for when the cell resides at two different positions within the IC of FIG. 1.
Figure 5:
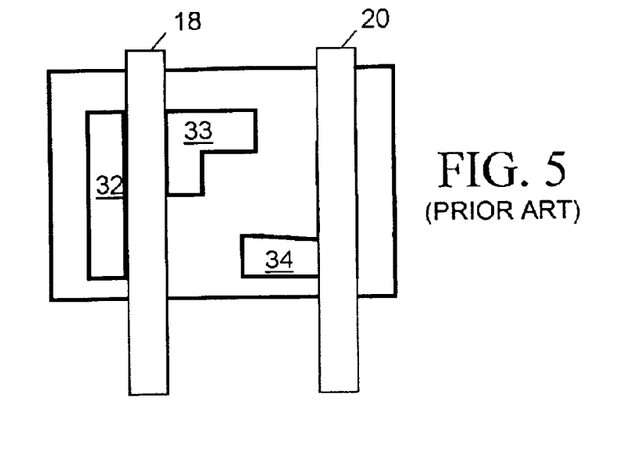

As illustrated in FIG. 4, when north/south power and ground lines 18 and 20 pass over a cell 10, one or more of those lines can completely cover one or more of the cell's I/O terminals 32–34, rendering them inaccessible to vias 27 of FIG. 2. In the example of FIG. 4, a power line 18 completely covering cell I/O terminal 32 blocks via access to that I/O terminal. As illustrated in FIG. 5, if cell 10 were to be moved slightly to the west, I/O terminal 32 would become accessible to a via. Although ground line 20 of FIG. 5 covers a portion of I/O terminal 34, a sufficient amount of area of each I/O terminal 32–34 is exposed to permit via access to each I/O terminal. Thus once a placement and routing (P&R) tool has initially positioned cells in an IC layout, it is necessary for the tool to determine whether power or ground lines block via access to I/O terminals of any of the cells, and then reposition cells to eliminate blockage.

Figure 6:
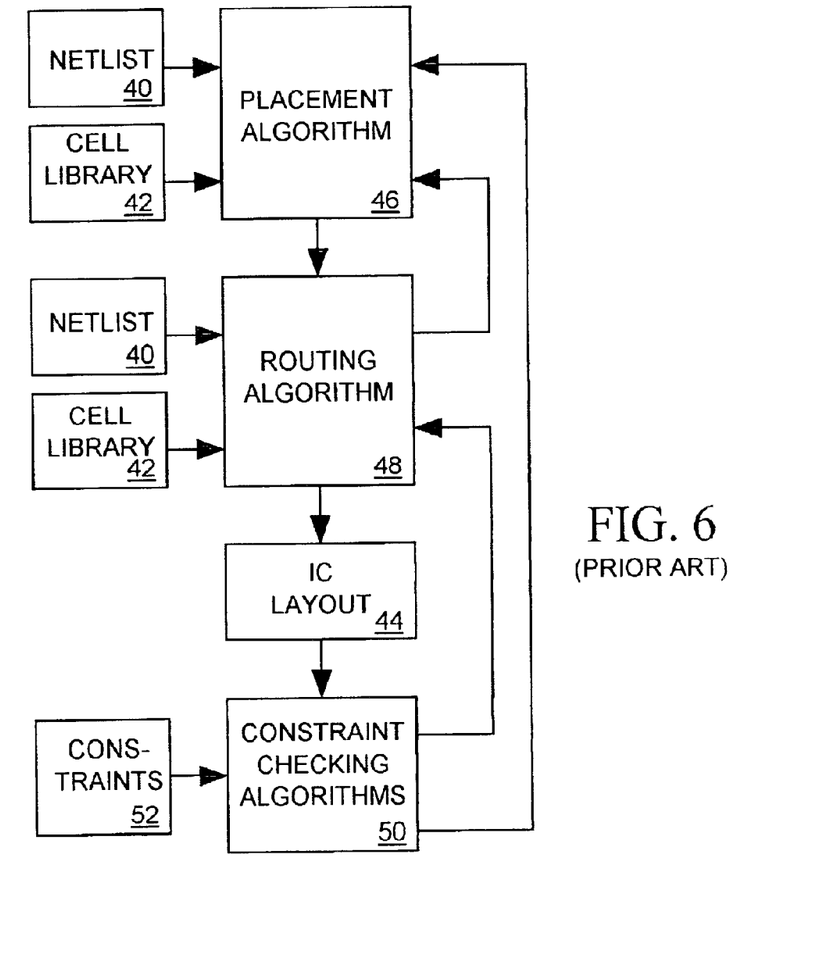
FIG. 6 is a simplified process flow diagram illustrating how a prior art placement and routing tool generates an IC layout for an IC described by a netlist.

FIG. 6 illustrates a prior art process of determining where each cell is to be placed in an IC and for also determining how the nets interconnecting cell I/O terminals are to be routed. An IC designer typically produces a high level IC design in the form of a netlist 40 referencing each cell to be included in an IC and indicating which of the various cell I/O terminals are to be interconnected to one another and which cell I/O terminals are to be connected to the IC's input and output terminals. A cell library 42 describes the layout of each type of cell that may be incorporated into the IC, and netlist 40 references each cell to be included in the IC by referencing the entry in cell library 42 describing that cell type. After creating netlist 40, the IC designer typically employs a computer-based placement and routing tool to generate a layout 44 including a placement plan indicating a position and orientation within rows 12 (FIG. 1) for each cell 10 referenced by netlist 40 and a routing plan describing how the conductors (nets) interconnecting I/O terminals of those cells are to be routed through the various layers and vias of the IC.

The P&R tool initially employs a placement algorithm 46 to produce the placement plan indicating the position of each cell 10 within one of cell rows 12 (FIG. 1). Placement algorithm 46 consults netlist 40 to determine which cells are to be included in the IC and consults cell library 42 to determine the size of each cell. Netlist 40 also tells placement algorithm 46 which cell terminals are to be connected to one another via nets, and the placement algorithm tries to position highly interconnected cells near one another to reduce net lengths.

After employing placement algorithm 46 to generate a placement plan establishing a position for each cell, the P&R tool employs a routing algorithm 48 that attempts to generate a routing plan indicating how each net is to be routed. When it is not possible for routing algorithm 48 to route each net, placement algorithm 46 modifies the placement plan to reposition cells, and routing algorithm 48 again attempts to develop a routing plan based on the modified placement plan. One or more such iterations may be needed before routing algorithm 48 is able to successfully produce a routing plan.

Constraint checking algorithms 50 check IC layout 44 routing plans forming IC layout 44 to determine whether they meet various constraints 52 on the IC layout. For example constraints 52 may place limits on signal delays through various signal paths within the IC or may place limits on the power density in an area of an IC. When the layout fails to meet one or more of constraints 52, placement and routing algorithms 46 and 48 are requested to modify the IC layout. Thus the P&R tool carries out a highly iterative process in which it may generate many different placement and routing plans in the process of developing an IC layout 44 satisfying all constraints 52.

When routing algorithm 48 finds that an I/O terminal of any cell is blocked by a power or ground line, it determines that the placement plan is unroutable and must be modified. The recent trend toward increasing the density of power and ground lines has increased the amount of time a P&R tool requires to generate a layout by increasing the likelihood of cell I/O terminal blockage, thereby increasing the likelihood that routing algorithm 48 will find any given placement plan produced by placement algorithm 64 to be unroutable. Since routing algorithm 48 typically requires substantial processing time when it tries to produce a routing plan, the placement and routing process could be speeded up if the P&R tool could prevent routing algorithm 48 from attempting to develop a routing plan for a version of a placement plan that is unroutable due to via blockage. Therefore what is needed is a computationally efficient method a P&R tool can use for quickly processing a placement plan to identify via blockages and for modifying the placement plan as necessary to eliminate such blockages before the P&R tool attempts to develop a routing plan.

BRIEF SUMMARY OF THE INVENTION

The invention relates to a placement and routing (P&R) tool for generating placement and routing plans for an integrated circuit (IC), and in particular to a method a P&R tool can employ to determine whether a placement plan positions any of the IC's cells such that power and ground conductors block via access to any cell's input/output (I/O) terminals. The method is suitably incorporated into software stored on computer readable media which when read and executed by a computer causes the computer to act as a P&R tool.

An IC placement plan arranges the cells into a set of parallel rows, each extending in a horizontal "east/west" direction, each cell spanning several contiguous "via spaces" in that direction, with each via space being sufficiently wide to contain a via extending upward from any I/O terminal occupying that via space. In accordance with the present invention, the IC placement plan is processed to generate a separate first data word corresponding to each I/O terminal of each cell of the IC. Each bit of each first data word corresponds to a separate one of the via spaces spanned by the cell containing the I/O terminal and indicates whether that via space is occupied by that I/O terminal. For example the bit's state is suitably set to a logical 1 if the corresponding via space is occupied by the I/O terminal and set to a logical 0 otherwise.

The IC design is also processed to generate a second data word for each cell, wherein each bit of the second data word also corresponds to a separate one of the via spaces spanned by the cell and is of a state indicating whether that via space is covered by any one of the power or ground conductors. For example the state each bit of the second data word may be set to a logic 0 when the corresponding via space is covered by one of the conductors and otherwise set to a logical 0.

The second data word for each cell is then logically combined (for example ANDed or NANDed) with corresponding bits of the first data word corresponding to each of its I/O terminals to produce a set of third data words, each corresponding to a separate I/O terminal of the cell and indicating whether any power and ground conductors block via access to that I/O terminal. The cell is repositioned when any one of the third data words indicates that one of its I/O terminals of a cell is blocked.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIGS. 9A–11A, 9B–11B data words generated by the via unblocking algorithm of FIG. 7.

DETAILED DESCRIPTION OF THE INVENTION

The present invention relates to software stored on computer readable media which when read and executed by a conventional computer causes the computer to act as a placement and routing (P&R) tool for generating a layout for an integrated circuit (IC). Suitable computer readable media for storing the software includes, but is not limited to, compact disks, floppy disks, read only memory, random access memory. The specification below describes an example implementation of the invention considered by the applicant(s) to be a best mode of practicing the invention.

The invention relates in particular to a computationally efficient method for use by a P&R tool for checking a placement plan indicating a position of each cell in an IC layout to determine whether the IC's power and ground lines will block via access to I/O terminals of any cell. As illustrated in FIGS. 1 and 2, the various cells 10 of an integrated circuit are typically formed within a semiconductor substrate 22 along a set of "east-west" extending rows 12. The cells 10 along each row 12 are normally of uniform height but vary in width, and may or may not include spaces between adjacent cells 10 along any row 12. Power and ground lines 14 and 16 extending in east/west directions parallel to each row 12 deliver power and ground to each cell 10 along the row. An array of ground lines 20 extending in a north/south direction on an IC layer 24 above cells 10 and ground lines 16 tie all of the east/west ground lines 16 together though vertically extending conductors (vias) 11. Similarly, an array of north/south extending power lines 18 residing on another layer 26 above cells 10 and power lines 14 tie all of the east/west power lines 14 together through vias 13. Power lines 14 and 20 and ground lines 16 and 18 thus form separate power and ground distribution grids for distributing power and ground from the IC's external power and ground terminals to all cells 10.

FIG. 3 is a simplified plan view of a cell 10 showing a set of conductive areas 32, 33 and 34 on the upper surface of the cell that act as the cell's input/output (I/O) terminals 25. As illustrated in FIG. 4, when north/south power and ground lines 18 and 20 pass over a cell 10, one or more of those lines can completely cover one or more of the cell's I/O terminals 32–34, rendering them inaccessible to vias 27 of FIG. 2. In the example of FIG. 4, a power line 18 completely covering cell I/O terminal 32 renders that I/O terminal inaccessible to a via. As illustrated in FIG. 5, when cell 10 is instead positioned more to the west, I/O terminal 32 is uncovered and accessible for via access.

Figure 7:
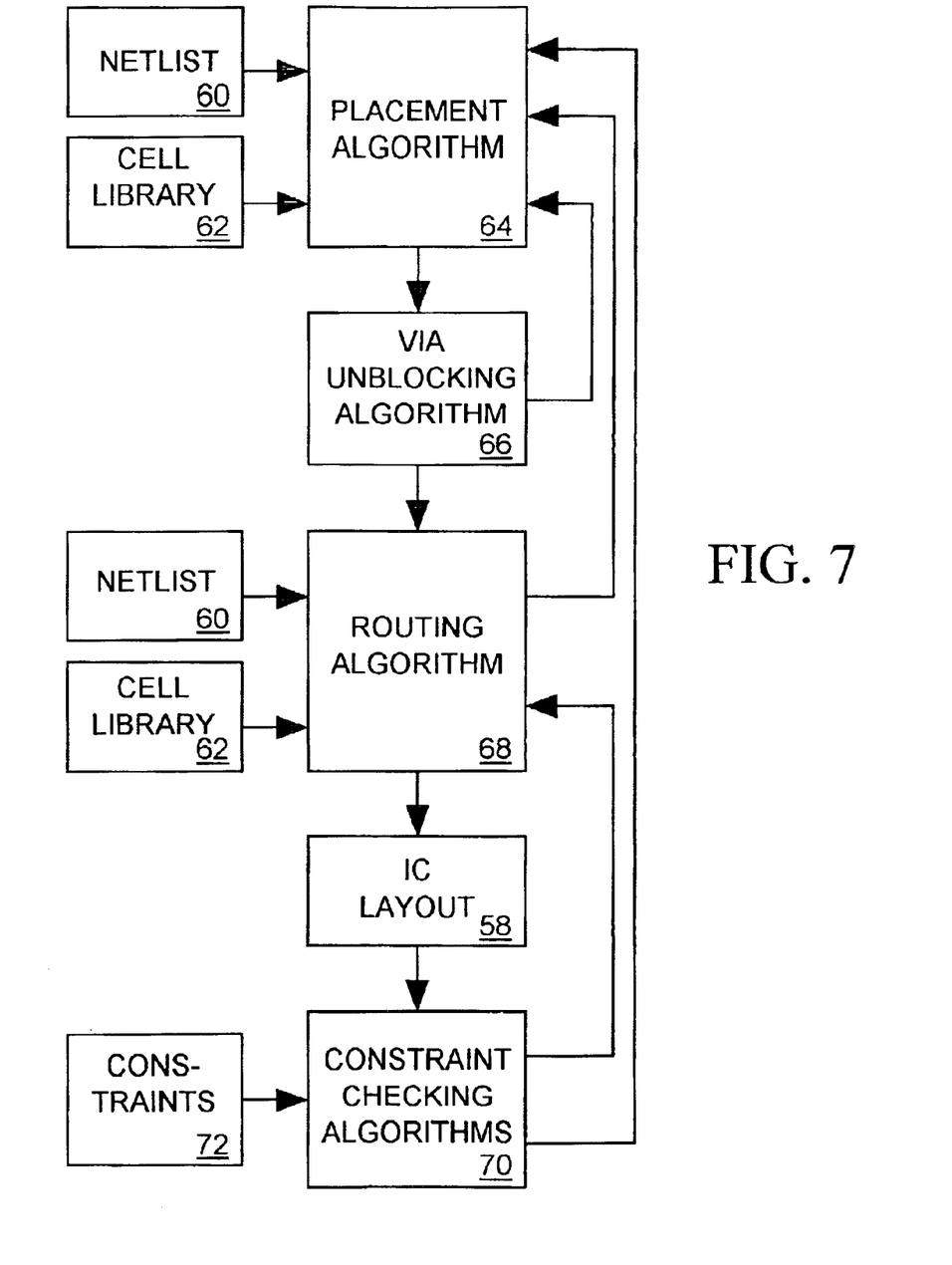
FIG. 7 is a simplified process flow diagram illustrating how a placement and routing tool employing a via unblocking algorithm in accordance with the invention generates a layout based on a netlist description of a cell.

FIG. 7 illustrates a process carried out by a P&R tool in accordance with the invention for generating an IC layout 58 for an IC described by a netlist 60. Netlist 60 references each cell to be included in the IC and indicates which of the various I/O terminals are to be interconnected to one another or to the input and output terminals of the IC. A cell library 62 describes the layout of each type of cell that may be incorporated into the IC, and netlist 60 references each cell to be included in the IC by referencing the entry in cell library 62 describing that cell type.

The computer-based P&R tool in accordance with the invention initially employs a conventional placement algorithm 64 to produce a placement plan indicating a position of each cell 10 referenced by netlist 60 within one of cell rows 12 (FIG. 1). Placement algorithm 64 consults netlist 60 to determine which cells are to be included in the IC and consults cell library 62 to determine the size of each cell. After employing placement algorithm 46 to generate a placement plan establishing a position for each cell, the P&R tool employs a "via unblocking" algorithm 66 in accordance with the invention for checking the placement plan to determine whether power or ground lines 18 or 20 block via access to I/O terminals of any cell 10 is blocked, and if so, for modifying the placement plan to relocate cells 10 as necessary to eliminate via blockages.

After algorithm 66 successfully modifies the placement plan to eliminate any via blockages, the P&R tool employs a conventional routing algorithm 68 to generate a routing plan indicating how each net is to be routed. When it is not possible for routing algorithm 68 to route each net, placement algorithm 64 generates a new placement plan, algorithm 66 modifies the new placement plan as necessary to eliminate via blockages, and routing algorithm 68 attempts to develop a routing plan based on the new placement plan. One or more such iterations may be needed before routing algorithm 68 is able to successfully produce a routing plan.

Thereafter conventional constraint checking algorithms 70 check the placement and routing plans forming IC layout 58 to determine whether they meet various constraints 72 on the IC layout. Should the layout fail to meet one or more of constraints, the P&R tool again employs algorithms 64, 66 and 68 to generate a modified version of the IC layout. The iterative process continues until the P&R tool develops an IC layout 58 meeting all constraints 72.

Figure 8:
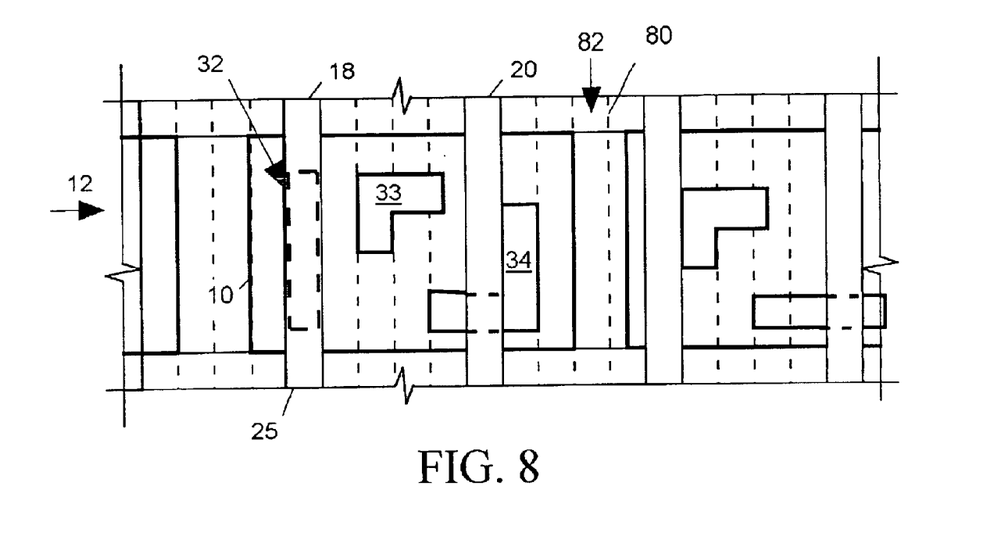
FIG. 8 is a simplified plan view of a row of cells in an IC layout residing under an array of power and ground lines.

As illustrated in FIG. 8, via blockage checking and cell relocation algorithm 66 of FIG. 7 divides each row 12 of cells described by an IC placement plan into a set of "via spaces" 82 having edges positioned as indicated in FIG. 8 by a set of regularly spaced grid lines 80. The width of each via space 80 is at least as large as the minimum width needed to accommodate a via 27 for linking an I/O terminal 25 to a conductor 29 residing on a layer 28 above the cell as illustrate in FIG. 2. The algorithm then generates a separate data word for each I/O terminal of each cell 10 along each row 12. The data word for each terminal of a cell includes a separate bit corresponding to each via space 82 spanned by that cell 10, and each bit indicates whether the I/O terminal occupies the corresponding via space 82.

Figure 9A:
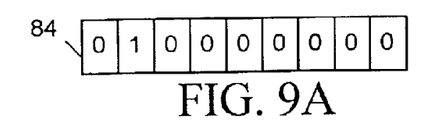
Figure 9B:
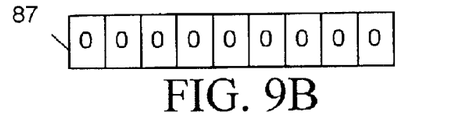
Figure 10A:
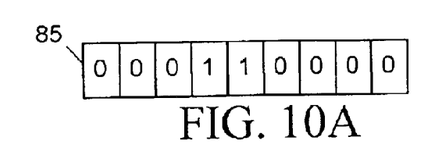
Figure 10B:
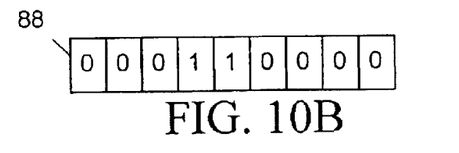
Figure 11A:
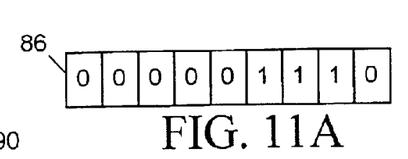
Figure 11B:
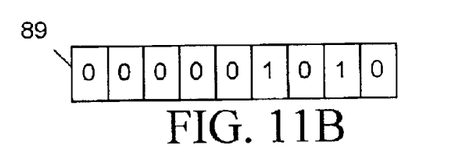

FIG. 9A illustrates a data word 84 the algorithm generates for I/O terminal 32 of FIG. 8. The data word is 9 bits wide because cell 10 of FIG. 8 spans 9 via spaces 82. Since I/O terminal 32 occupies only the second via space 82 from the left on cell 10, the algorithm sets only the second bit from the left of word 84 to a logical 1 and sets all other bits of the word to a logical 0. FIGS. 9A and 10A illustrate data words 85 and 86 the algorithm generates for I/O terminals 33 and 34, respectively, of FIG. 8.

Figure 12:
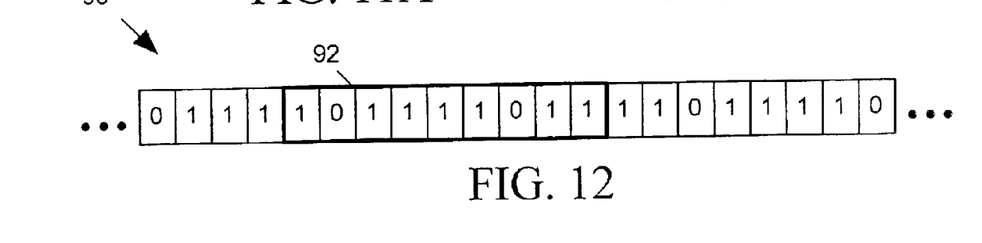
FIG. 12 represents a data bit sequence generated by the via unblocking algorithm of FIG. 7.

The algorithm also generates a data string 50 for each row 12 as illustrated in FIG. 12, including a separate bit corresponding to each via space 82 along the row. The bit for each via space indicates whether a power or ground line 18 or 20 resides above that via space, with the bit being set to 1 to indicate a power or ground line does not occupy the via space or to a 0 to indicate a power or ground line does occupy the space. Data string 50 will be similar for all rows in any IC layout in which all rows are of uniform width and in which all power and ground conductors 18 and 20 extend uniformly across all rows. In such case it is necessary to generate only one data string 50, rather than one data string 50 per row.

Referring to FIG. 8, to determine whether any selected cell 10 is positioned along any selected row 12 in a way that allows via access to each of its I/O terminals 32–34, the algorithm need only logically AND the data words 84–86 for each of the cell's terminals 32–34 with a word formed by the set of bits 52 of data sequence 90 corresponding to the set of via spaces 82 occupied by cell 10. FIGS. 9B–10B illustrate 9-bit words 87–89 produced by ANDing the appropriate 9-bit sequence 92 with words 84–86 of FIGS. 9A–11A, respectively. When at least one of words 87–89 lacks at least one bit of value 1, then the algorithm will know that power or ground lines block via access to at least one of terminals 32–34. The algorithm can then quickly test whether shifting the cell one or more spaces 82 to the left or right will improve via access simply by selecting a new bit word 92 from bit sequence 90 corresponding to the proposed new position for cell 10 and again ANDing words 84–86 with the newly selected sequence. The algorithm can use a similar method to determine whether moving a cell to a vacant position, if any, in a nearby row 12 will eliminate the via blockage.

Figure 13:
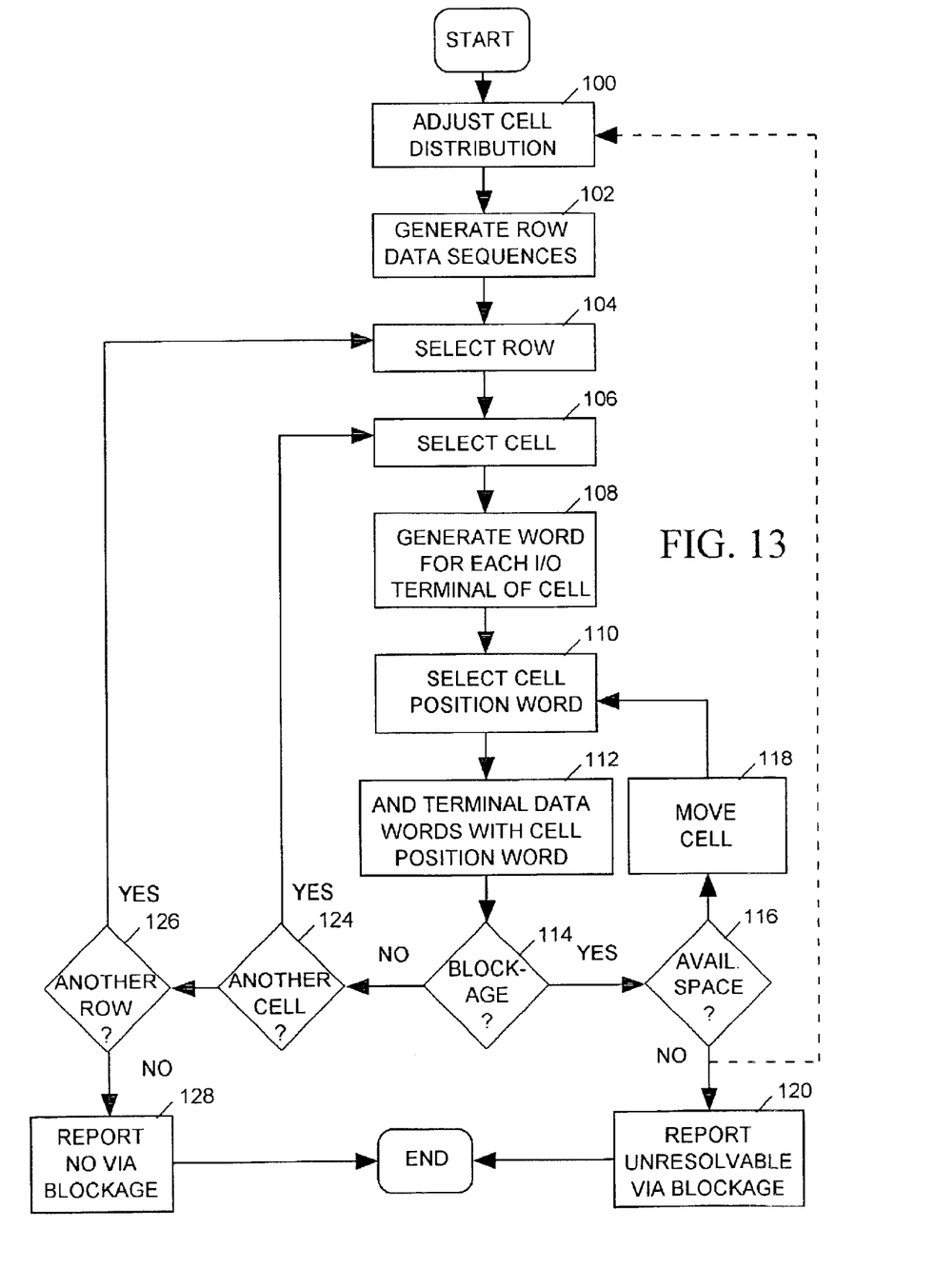
FIG. 13 is a flow chart illustrating steps of the via unblocking algorithm of FIG. 7 in accordance with the invention.

FIG. 13 illustrates via unblocking algorithm 66 of FIG. 7 in more detail. The algorithm identifies each cell having I/O terminals blocked by power and ground lines for via access and then attempts to reposition the cell so as to eliminate the blockage. As illustrated in FIGS. 4 and 5, a via blockage can usually be eliminated by moving a cell one or two spaces to the right or left along its row, if vacant space is available on either side of the cell along its row, or by moving the cell to an adjacent row when space is available.

In order to increase the likelihood that the algorithm will be able to move cells to eliminate blockages, it is helpful to initially modify the placement plan (step 100) to more evenly distribute cells when necessary to reduce the cell density in densely packed areas of the layout where there is little space between cells. U.S. provisional patent application 60/342,011, entitled "Detailed Physical Placement Using Quadratic Approach" filed Dec. 18, 2001, and incorporated herein by reference, describes an efficient algorithm for determining how to modify a placement plan to reduce the number of cells residing in densely packed areas of an IC layout by increasing the number of cells residing in less densely packed areas of the layout in a manner that minimizes the overall disturbance to the placement plan. That algorithm can be used to implement step 100 of the method FIG. 13. By more evenly distributing cells, the algorithm also helps to more evenly distribute the IC's power load and helps to reduce the likelihood of routing congestion. Although cell distribution adjustment step 100 helps to increase the likelihood that a cell having blocked via access can be repositioned without disturbing cells around it, step 100 is optional.

After optionally adjusting cell distribution at step 100, the via unblocking algorithm generates a separate row data sequence corresponding to each row (step 102), as illustrated for example in FIG. 12, indicating which via spaces 82 (FIG. 8) along the row are occupied by power or ground lines 18 and 20. The algorithm then selects one of the cell rows (step 104), selects one of the cells of the selected row (step 106), and then generates a separate data word each I/O terminal of the selected cell, as illustrated for example in FIGS. 8A–10A, indicating which via spaces 82 of the selected cell the I/O terminal occupies. The algorithm also selects a cell position word, such as word 92 of FIG. 12, corresponding to the position of the selected cell from the row data sequence for the selected row (step 110). The algorithm then determines whether the selected cell is subject to a via blockage (step 114) by ANDing each of the terminal data words with the cell position word to determine whether each of the resulting words, such as words 87–89 of FIGS. 8B–10B, indicate existence of via blockage one any of the cell's I/O terminals.

If a blockage is found to exist at step 114, then the algorithm determines whether there is sufficient vacant space near the cell to allow the cell to be moved to the right or left or to an adjacent row (step 116). If so, then the algorithm modifies the placement plan to move the cell and then repeats steps 110–112 to determine whether via access to any of the cell's terminals is blocked at its new position. The algorithm continues to loop though steps 110–118 trying each available position for the cell, until at step 114 it finds a position for which there is no via blockage, or until at step 116 it determines that there are no more available positions for that cell to test. In that case, the algorithm can optionally return to step 100 and adjust cell distribution so as to make more space available in the vicinity of that particular cell and then repeat the entire process. Otherwise, should the algorithm determine at step 116 that every available position for the cell results in a via blockage, the algorithm returns an indication that the placement plan has an un-resolvable via blockage (step 120), and then terminates. At that point, the P&R tool can use placement algorithm 64 (FIG. 7) to modify the placement plan.

When the selected cell is found at step 114 (FIG. 13) to be free of via blockage, and there is another cell having I/O terminals and residing on the selected row that has not yet been checked for via blockage (step 124), the algorithm selects the next cell (step 106) and then repeats steps 108–118 to check that cell for via blockage and, if necessary, to reposition the cell to eliminate via blockage. When the algorithm has checked and repositioned as necessary all cells of the selected row, and there are other cell rows to be checked (step 126), the algorithm selects a next row at step 104 and repeats the process for that row. The algorithm continues to loop through steps 104 through 126 until every cell of every row has been checked for via blockage and repositioned as necessary. At that point the algorithm reports that the placement plan is free of via blockages (step 128) and then terminates. The P&R tool can then employ routing algorithm 68 (FIG. 7) to develop a routing plan.

Via unblocking algorithm 66 of FIG. 7 can check and modify a placement plan to eliminate via blockages at cell I/O terminals in much less time than conventional routing algorithm 68 normally needs to develop a routing plan based on a placement plan. Thus the use of via unblocking algorithm 66 in accordance with the invention to detect and eliminate via blockages prior to submitting the placement plan to routing algorithm 68 can provide a substantial reduction in the time the P&R tool needs to generate an acceptable IC layout 58 by substantially by preventing the P&R tool from using routing algorithm 68 in a vain attempt to create a routing plan for a placement plan subject to via blocking. In the best mode of practicing the invention, as described above, when generating the data words 84–86 (FIGS. 9A–11A) for each I/O terminal, each bit is set to a logical 1 when the corresponding I/O terminal occupies a via space corresponding to that bit and is otherwise set to a logical 0. Also in the data word 92 of FIG. 12, each bit is a logical 1 when a corresponding via space is not occupied by a power or ground conductor and is otherwise set to a 0. In such case a via blockage is indicated when all of the bits of any of words 87–89 resulting from the ANDing of word 92 with corresponding words 84–86 are all logical 0's. However those of skill in the art will understand that many logically equivalent approaches are possible. For example, in one alternative mode of practicing the invention, the bits of words 84–86 could be NANDed rather than ANDed with bits of word 92 when producing words 87–89. In such case, a via blockage would be indicated when all of the bits of any of words 87–89 are logical 1's rather than logical 0's. In other alternative embodiments of the invention, a logical 1 bit of any of words 84–86 could mean an I/O terminal does not occupy a via space, and/or a logical 1 bit of word 92 could mean that a conductor does occupy a via space, provided that the logical operation carried out on those words to produce words 87–89 and the manner in which words 87–89 are interpreted is adjusted accordingly.

Also while the method in accordance with the invention can be used as described herein above to determine whether conductors conveying power and ground signals block via access to cell I/O terminals, those of skill in the art will appreciate that the method can be used to determine whether conductors conveying other types of signals block access to cell I/O terminals.

Thus while descriptions of elements or steps of the invention are provided in the drawings and specification as examples of best modes for implementing elements or steps of the invention as recited in the appended claims, those of ordinary skill in the art will understand that other modes of implementing elements or steps recited in the claims are possible. Therefore it is not intended that recited elements or steps recited in the claims be interpreted as being limited only to the particular best mode examples of such elements or steps described in the drawings and specification when the language of the claims allows them to be more broadly interpreted.

What is claimed is:

1. A method for processing an integrated circuit (IC) design indicating positions of cells of an IC within rows occupying a horizontal plane and extending in a horizontal first direction, and indicating positions of conductors residing above the horizontal plane and extending in a horizontal second direction transverse to the first direction, wherein a plurality of the cells include I/O terminals, wherein each cell of the plurality of cells occupies a plurality of contiguous via spaces in the first direction, each via space being of dimension in the first direction sufficient to contain a via extending upward from any of the I/O terminals, and wherein each I/O terminal of the plurality of cells occupies at least one via space in the first direction, the method comprising the steps of:

a. choosing one of the plurality of cells as a selected cell;
   b. processing the design to generate a separate first data word corresponding to each I/O terminal of the selected cell, wherein each bit of the first data word corresponds to a separate one of the via spaces occupied by the selected cell and indicates whether that via space is also occupied by the I/O terminal corresponding to that first data word;
   c. processing the design to generate a second data word, wherein each bit of the second data word corresponds to a separate one of the via spaces occupied by the selected cell in the first direction and indicates whether that via space is also occupied by any one of the conductors; and
   d. for each first data word generated at step b, generating a third data word having bits of states that are logical function of states of bits of that first data word and of bits of the second data word, wherein the states of the bits the third data word indicate whether the conductors occupy all via spaces also occupied by the I/O terminal corresponding to that first data word.

2. The method in accordance with claim 1 further comprising the step of:

e. repeating steps a–d once for each of the plurality of cells including I/O terminals, with a separate one of the plurality of cells being chosen as the selected cell during each repetition of step a.

3. The method in accordance with claim 1 further comprising the steps of:

e. when the third word generated at step d indicates that the conductors occupy all via spaces occupied by the I/O terminal corresponding to the first word, modifying the design to indicate that the selected cell occupies a different position within one of the rows, and then repeating steps c and d.

4. The method in accordance with claim 3 further comprising the step of:

f. repeating steps a–e once for each of the plurality of cells, with a separate one of the plurality of cells being chosen as the selected cell during each repetition of step a.

5. The method in accordance with claim 1, wherein a state of each bit of each third data word generated at step d is either a logical AND or a logical NAND function of states of bits of first and second data words corresponding to a same via space occupied by the selected cell.

6. The method in accordance with claim 1, wherein each bit of each first data word generated at step b is set to a logical 1 when its corresponding via space is occupied by the I/O terminal corresponding to the first data word and is otherwise set to a logical 0,
   wherein each bit of the second data word generated at step c is set to a logical 1 when its corresponding via space is not occupied by one of the conductors and is otherwise set to a logical 0, and
   wherein each bit of each third data word generated at step d is a logical AND of bits of first and second data words corresponding to a same one of the via spaces occupied by the selected cell.

7. Computer readable media storing software which when read and executed by a computer causes the computer to carry out a method for processing an integrated circuit (IC) design indicating positions of cells of an IC within rows occupying a horizontal plane and extending in a horizontal first direction, and indicating positions of conductors residing above the horizontal plane and extending in a horizontal second direction transverse to the first direction, wherein a plurality of the cells include I/O terminals, wherein each cell of the plurality of cells occupies a plurality of contiguous via spaces in the first direction, each via space being of dimension in the first direction sufficient to contain a via extending upward from any of the I/O terminals, and wherein each I/O terminal of the plurality of cells occupies at least one via space in the first direction, wherein the method comprises the steps of:

a. choosing one of the plurality of cells as a selected cell;
   b. processing the design to generate a separate first data word corresponding to each I/O terminal of the selected cell, wherein each bit of the first data word corresponds to a separate one of the via spaces occupied by the selected cell and indicates whether that via space is also occupied by the I/O terminal corresponding to that first data word;
   c. processing the design to generate a second data word, wherein each bit of the second data word corresponds to a separate one of the via spaces occupied by the selected cell in the first direction and indicates whether that via space is also occupied by any one of the conductors; and
   d. for each first data word generated at step b, generating a third data word having bits of states that are logical function of states of bits of that first data word and of bits of the second data word, wherein the states of the bits the third data word indicate whether the conductors occupy all via spaces also occupied by the I/O terminal corresponding to that first data word.

8. The computer readable media in accordance with claim 7 wherein the method further comprises the step of:

e. repeating steps a–d once for each of the plurality of cells including I/O terminals, with a separate one of the plurality of cells being chosen as the selected cell during each repetition of step a.

9. The computer readable media in accordance with claim 7 wherein the method further comprises the steps of:

e. when the third word generated at step d indicates that the conductors occupy all via spaces occupied by the I/O terminal corresponding to the first word, modifying the design to indicate that the selected cell occupies a different position within one of the rows, and then repeating steps c and d.

10. The computer readable media in accordance with claim 9 wherein the method further comprises the step of:

f. repeating steps a–e once for each of the plurality of cells, with a separate one of the plurality of cells being chosen as the selected cell during each repetition of step a.

11. The computer readable media in accordance with claim 7, wherein a state of each bit of each third data word generated at step d is either a logical AND or a logical NAND function of states of bits of first and second data words corresponding to a same via space occupied by the selected cell.

12. The computer readable media in accordance with claim 7, wherein each bit of each first data word generated at step b is set to a logical 1 when its corresponding via space is occupied by the I/O terminal corresponding to the first data word and is otherwise set to a logical 0, wherein each bit of the second data word generated at step c is set to a logical 1 when its corresponding via space is not occupied by one of the conductors and is otherwise set to a logical 0, and wherein each bit of each third data word generated at step d is either a logical AND or a logical NAND of bits of first and second data words corresponding to a same one of the via spaces occupied by the selected cell.

13. A method for designing an integrated circuit (IC) layout based on a netlist describing cells to be included in the IC and indicating which input/output (I/O) terminals of the cells are to be interconnected to one another through nets, the method comprising the steps of:

a. processing the netlist to generate a placement plan indicating positions of cells of the IC within rows occupying a horizontal plane and extending in a horizontal first direction, and indicating positions of conductors for conveying power and ground signals, the conductors residing above the horizontal plane and extending in a horizontal second direction transverse to the first direction, wherein a plurality of the cells include I/O terminals, wherein each cell of the plurality of cells occupies a plurality of contiguous via spaces in the first direction, each via space being of dimension in the first direction sufficient to contain a via extending upward from any of the I/O terminals, and wherein each I/O terminal of the plurality of cells occupies at least one via space in the first direction;

b. choosing one of the plurality of cells as a selected cell;

c. processing the placement plan to generate a separate first data word corresponding to each I/O terminal of the selected cell, wherein each bit of the first data word corresponds to a separate one of the via spaces occupied by the selected cell and indicates whether that via space is also occupied by the I/O terminal corresponding to that first data word;

d. processing the placement plan to generate a second data word, wherein each bit of the second data word corresponds to a separate one of the via spaces occupied by the selected cell in the first direction and indicates whether that via space is also occupied by any one of the conductors;

e. for each first data word generated at step c, generating a third data word having bits of states that are logical function of states of bits of that first data word and of bits of the second data word, wherein the states of the bits the third data word indicate whether the conductors occupy all via spaces also occupied by the I/O terminal corresponding to that first data word;

f. when any third data word generated at step e indicates that the conductors occupy all via spaces occupied by an I/O terminal of the selected cell, modifying the placement plan to indicate that the selected cell occupies a different position within one of the rows, and then repeating steps c and d;

g. repeating step f until no third word generated at step e indicates the conductors do not occupy all via spaces of any I/O terminal of the selected cell;

h. repeating steps b–g once for each of the plurality of cells, with a separate one of the plurality of cells being chosen as the selected cell during each repetition of step b; and i. following step h, processing the netlist and the placement plan to generate a routing plan describing signal paths for interconnecting I/O terminals of the cells, wherein the signal paths include vias for accessing I/O terminals of the cells.

14. The method in accordance with claim 13, wherein a state of each bit of each third data word generated at step e is either a logical AND or a logical NAND function of states of bits of first and second data words corresponding to a same via space occupied by the selected cell.

15. The method in accordance with claim 13, wherein each bit of each first data word generated at step c is set to a logical 1 when its corresponding via space is occupied by the I/O terminal corresponding to the first data word and is otherwise set to a logical 0, wherein each bit of the second data word generated at step d is set to a logical 1 when its corresponding via space is not occupied by one of the conductors and is otherwise set to a logical 0, and wherein each bit of each third data word generated at step e is either a logical AND or a logical NAND of bits of first and second data words corresponding to a same one of the via spaces occupied by the selected cell.

16. The method in accordance with claim 13 further comprising the step of:

j. prior to step b, modifying the placement plan to indicates cells are repositioned in a manner that reduces cell density in selected areas of the horizontal plane.

* * * * *